United States Patent [19]

Nakano et al.

[11] Patent Number: 5,626,681
[45] Date of Patent: May 6, 1997

[54] METHOD OF CLEANING SEMICONDUCTOR WAFERS

[75] Inventors: Masami Nakano; Isao Uchiyama, both of Fukushima-ken; Hiroyuki Takamatsu, Shirakawa, all of Japan

[73] Assignee: Shin-Etsu Handotai Co., Ltd., Tokyo, Japan

[21] Appl. No.: 544,464

[22] Filed: Oct. 18, 1995

[30] Foreign Application Priority Data

Oct. 21, 1994 [JP] Japan ................... 6-257032

[51] Int. Cl.⁶ ............................................ B08B 3/08
[52] U.S. Cl. .................. 134/3; 216/88; 438/691; 438/753
[58] Field of Search .................. 134/1.3, 3; 156/653.1, 156/636.1; 216/88

[56] References Cited

U.S. PATENT DOCUMENTS

| | | | |
|---|---|---|---|
| 4,116,714 | 9/1978 | Basi | 134/3 |
| 4,156,619 | 5/1979 | Griesshammer | 134/2 |
| 5,181,985 | 1/1993 | Lampert et al. | 156/635 |
| 5,317,778 | 6/1994 | Kudo et al. | 15/88.3 |
| 5,442,828 | 8/1995 | Lutz | 15/88.3 |
| 5,547,515 | 8/1996 | Kudo et al. | 134/21 |

FOREIGN PATENT DOCUMENTS

| | | |
|---|---|---|
| 0526245A1 | 2/1993 | European Pat. Off. |
| 03228328 | 10/1991 | Japan |
| 04113620 | 4/1992 | Japan |
| 05021412 | 1/1993 | Japan |
| 06314679 | 11/1994 | Japan |
| 07014817 | 1/1995 | Japan |

OTHER PUBLICATIONS

Patent Abstracts of Japan, vol. 12 No. 49, Feb. 13, 1988; & JP-A-62 198127 (Sanyo Electric) Sep. 1, 1987.
Patent Abstracts of Japan, vol. 18, No. 403, Jul. 27, 1994; & JP-A-06 120192 (Sumitomo) Apr. 28, 1994.
International Conference of Solid State Devices and Materials, Aug. 26–28, 1992, Tokyo, Japan, pp. 193–195, Isagawa et al. "Ultra Clean Surface Preparation Using Ozonized Ultrapure Water".

*Primary Examiner*—R. Bruce Breneman
*Assistant Examiner*—George Goudreau
*Attorney, Agent, or Firm*—Nikaido Marmelstein Murray & Oram LLP

[57] ABSTRACT

An improved semiconductor wafer cleaning method capable of cleaning wafers without degrading the surface roughness of the wafers includes the steps of cleaning a polished wafer with an aqueous solution of hydrofluoric acid, then rinsing the wafer with ozone-containing water, and thereafter brush-scrubbing the wafer.

4 Claims, 3 Drawing Sheets

METHOD OF CLEANING SEMICONDUCTOR WAFERS

BACKGROUND OF THE INVENTION

1. Field of the Invention

The present invention relates to an improvement in the method of cleaning semiconductor wafers (hereinafter referred to, for brevity, as "wafers").

2. Description of the Related Art

Wafers such as silicon wafers, after they are polished, are subjected to chemical cleaning with the use of a solution of ammonium hydroxide ($NH_4OH$), hydrogen peroxide ($H_2O_2$) and water ($H_2O$) to remove particles and organic compounds. The cleaning with $NH_4OH$—$H_2O_2$—$H_2O$ solution, however, degrades the surface roughness (micro-roughness) of the polished wafers due to an etching reaction effected thereon. It is known that the degradation of micro-roughness not only degrades the limit of particles disposed on a wafer surface which are detected by a particle counter using the scattering of a laser beam, but also lowers the breakdown voltage of an oxide film formed on the wafer which might eventually affect the yield and performance of semiconductor devices formed on this wafer surface.

SUMMARY OF THE INVENTION

With the foregoing drawbacks in view, an object of the present invention is to provide a semiconductor wafer cleaning method which is capable of cleaning wafer surfaces at a high efficiency without degrading the surface roughness (micro-roughness) of the wafers.

To attain the foregoing object, the present invention provides a semiconductor wafer cleaning method which comprises the steps of: cleaning a polished wafer surface with an aqueous solution of hydrofluoric acid; then rinsing the wafer surface with a composition consisting essentially of pure water containing ozone; and thereafter brush-scrubbing the wafer.

The rinsing composition has an ozone concentration, the lower limit of which is preferably 0.5 ppm. The upper limit of the ozone concentration is the saturated concentration. The ozone concentration, when smaller than 0.5 ppm, is unable to achieve a sufficient cleaning effect. The upper limit of the ozone concentration, i.e., the saturated concentration, which may vary with the temperature of the liquid rinsing composition and the concentration of ozone gas used in preparing the ozone-containing water, is about 40 ppm at a liquid temperature of 25° C.

The brush scrubbing is achieved with the use of pure water but may be done with a suitable cleaning agent added to the pure water.

To avoid degradation of the surface roughness (micro-roughness) of the wafer surface, cleaning should preferably be performed under conditions which do not support an etching reaction. Cleaning techniques which are non-etching in nature and have a sufficient cleaning effect may include the brush scrubbing process (cleaning by scrubbing with a brush). The brush scrubbing process, when it is simply applied to the polished wafers, does not provide a sufficient cleaning power due to a surfactant contained in a polishing agent left on the wafer surface. In view of this, prior to the brush scrubbing, the polished wafers are cleaned with a cleaning solution consisting of hydrofluoric acid to dissolve silica particles, derived from the polishing agent left on the wafer surface. Then, cleaning the thus treated surface with a rinsing composition of pure water and ozone to remove the surfactant contained in the polishing agent which has been left on the wafer surface. Thereafter, the brush scrubbing process is carried out with the result that dirt and residual impurities left on the wafer surface can be removed more efficiently.

The objects and features of the invention may be understood with reference to the following detailed description of the invention, taken together with the accompanying sheets of drawings.

DETAILED DESCRIPTION OF THE INVENTION

The present invention will be described below in greater detail by way of the following examples which should be construed as illustrative rather than restrictive.

Regarding a brush scrubbing apparatus used for carrying out the method of the present invention, any type of such brush scrubbing apparatus or scrubber can be used without specific limitation. For example, a brush scrubber proposed by the present assignee in Japanese Patent Application No. 3-226360 is suitably used.

Figure 3:
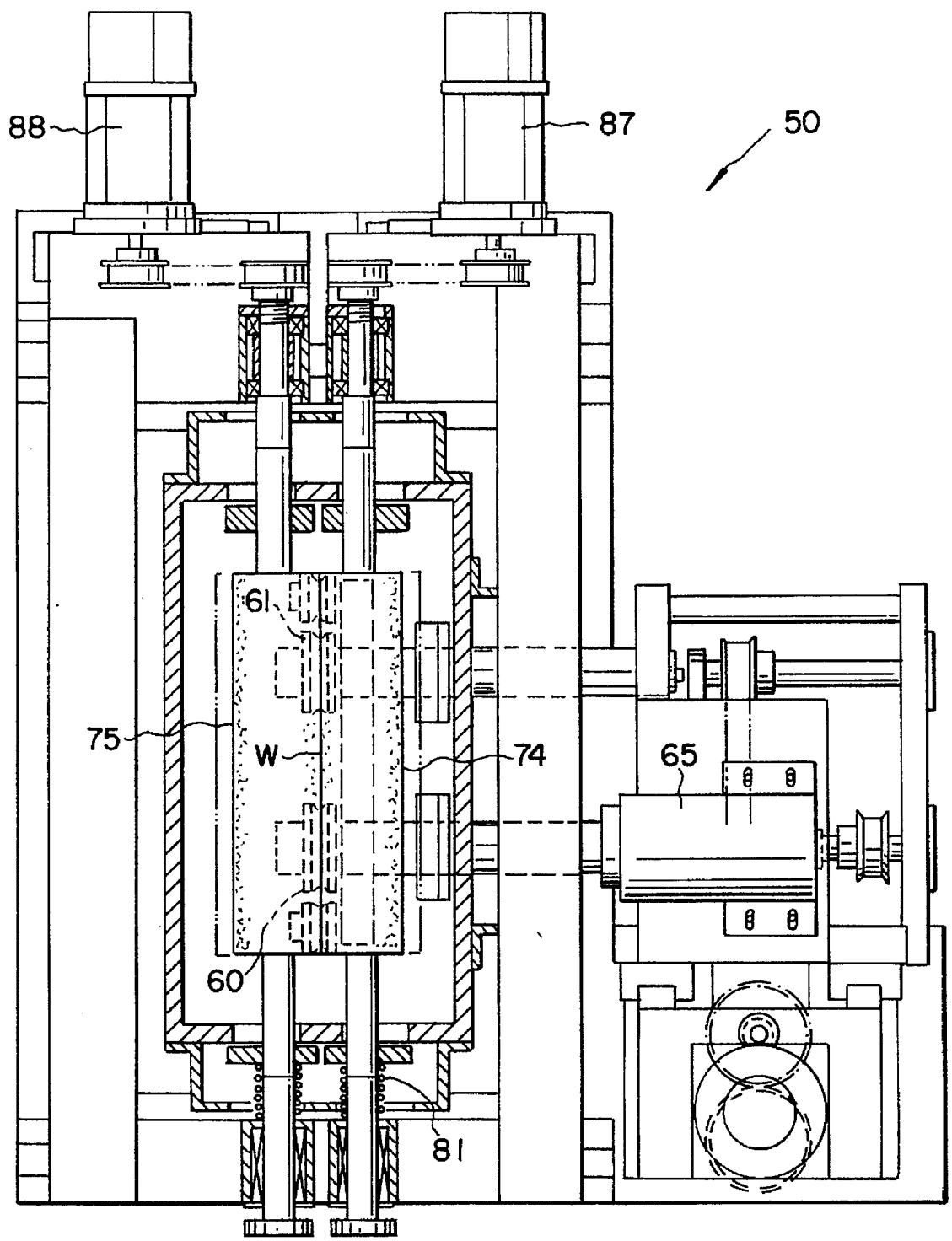
FIG. 3 is a plan view, with parts cutaway for clarity, of a brush scrubbing apparatus used for carrying out the method of the present invention.

FIG. 3 is a plan view, with parts cutaway for clarity, of the brush scrubber specified above. As shown in the same figure, the brush scrubber 50 includes a pair of horizontally and rotatably supported rotating brushes 74, 75, a pair of drive motors (brush driving means) 87, 88 for rotatably driving the rotating brushes 74, 75, respectively, a pair of drive rollers 60, 61 for rotatably driving a wafer W while it supporting thereon, and another drive motor (wafer driving means) 65. The wafer W is gripped between the rotating brushes 74, 75 with its outer peripheral portions supported on the drive rollers 60, 61. While keeping this condition, the drive motor 65 is driven to rotate the wafer W by means of the drive rollers 60, 61 and, at the same time, the drive motors 87, 88 are driven to rotate the rotating brushes 74, 75 whereupon the wafer W is cleaned on its opposite sides by the rotating brushes 74, 75.

EXAMPLE 1

Condition:

Sample wafer: Mirror-polished, p-type, <100>-oriented, 200 mm diameter, silicon wafer Cleaning with hydrofluoric acid (HF): HF concentration= 1% by weight, 25° C., 3 minutes.

Figure 1:
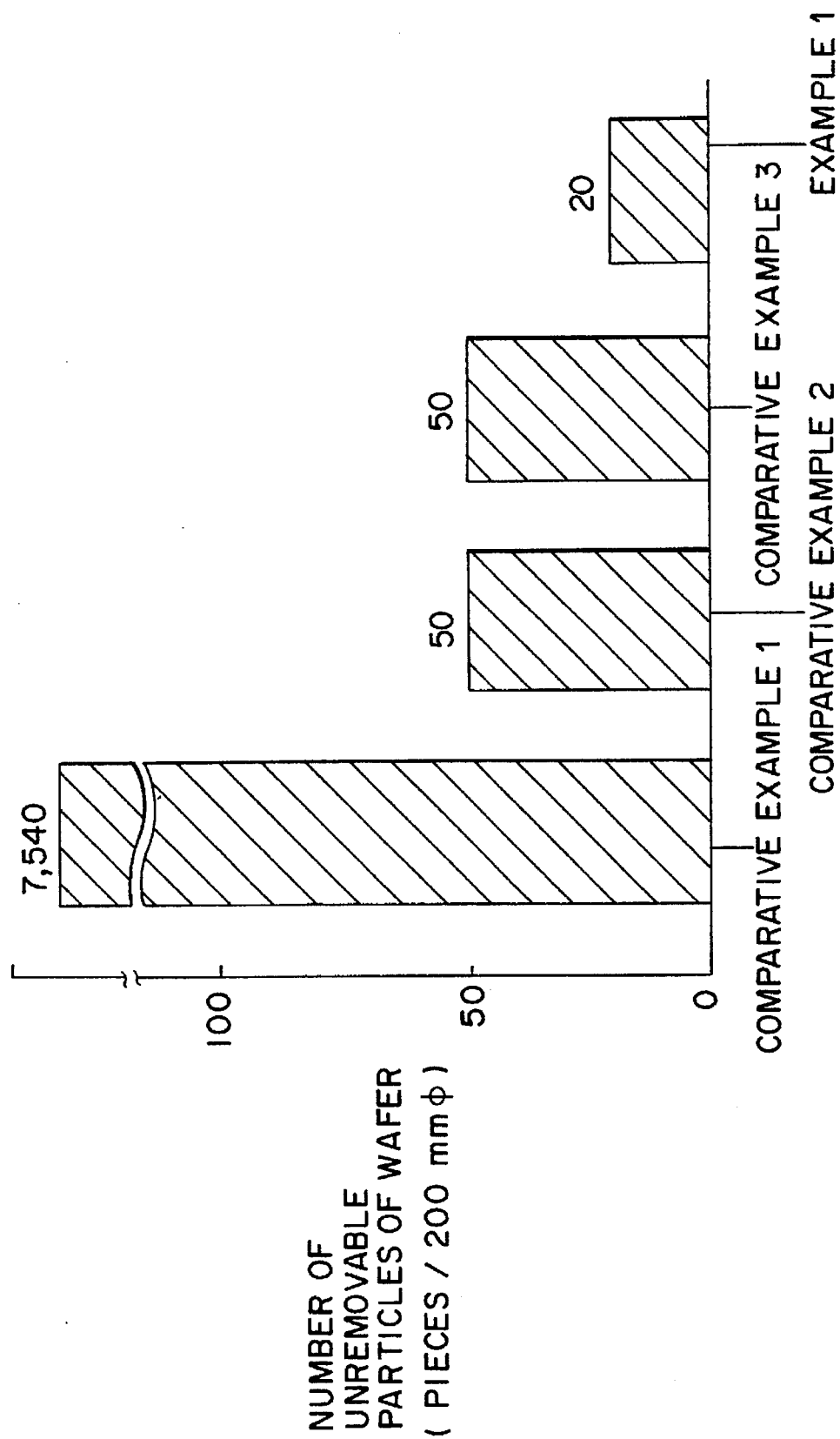
FIG. 1 is a graph showing the results of a measurement of particles left on the wafer surface after cleaning is achieved with respect to Example 1 and Comparative Examples 1–3.

Ozone-containing pure water: a supply of 2 liters per minute, 25° C., 3 minutes, ozone concentration=2 ppm Cleaning bath size (common to HF cleaning and ozone-containing pure water cleaning): 320×30×280 mm Brushes: made of nylon fiber Under the condition specified above, the sample wafer was cleaned with HF. Then, the HF-cleaned sample wafer was rinsed with the ozone-containing pure water, and after that the washed sample wafer was cleaned by scrubbing with rotating brushes of the brush scrubber shown in FIG. 3 while pure water is supplied to the rotating brushes. The brush-scrubbed wafer was then subjected to a post-cleaning process and a drying process both achieved in the usual manner. After that the numbers of particles (pieces/200 mmφ) of a size not smaller than 0.10 μm, which were left on the brush-scrubbed wafer, were measured by the use of a laser particle counter "LS-6000" (manufactured by Hitachi Electronics Engineering Limited). The results are shown in FIG. 1. As is apparent from FIG. 1, the measured numbers of particles were 20 pieces/200 mmφ. The brush-scrubbed wafer was also measured for its surface roughness (microroughness) by an atomic force microscope "Nanoscope 2" (manufactured by Digital Instruments Corporation) with the results shown in FIG. 2. As appears clear from FIG. 2, the measured surface roughness in RMS (root-mean-square) value was 0.16 nm.

COMPARATIVE EXAMPLE 1

A mirror-polished wafer similar to one used in Example 1 was directly subjected to the brush-scrubbing process achieved in the same brush scrubber, followed by post-cleaning and drying processes achieved in the usual manner. With respect to the brush-scrubbed wafer, numbers of particles and the surface roughness were measured in the same manner as Example 1 with the results shown in FIGS. 1 and 2, respectively. As is apparent from FIGS. 1 and 2, the measured numbers of particles were 7540 pieces/200 mmφ and the measured surface roughness in RMS value was 0.16 nm.

COMPARATIVE EXAMPLE 2

A mirror-polished wafer similar to one used in Example 1 was cleaned with 28% aqueous solution of ammonium hydroxide, 30% aqueous solution of hydrogen peroxide, and pure water in the ratio of 1:1:10 (volume) at 80° C. for 3 minutes. The cleaned wafer was then subjected to post-cleaning and drying processes achieved in the usual manner. To determine numbers of particles and the surface roughness of the cleaned wafer, measurements were carried out in the same manner as Example 1 with the results also shown in FIGS. 1 and 2, respectively. As is apparent from FIGS. 1 and 2, the measured numbers of particles were 50 pieces/200 mmφ and the surface roughness in RMS value was 0.20 nm.

COMPARATIVE EXAMPLE 3

Example 1 was repeated with the difference that the HF cleaning process was omitted. Then, numbers of particles and the surface roughness of the brush-scrubbed wafer were measured in the same manner as Example 1 with the results also shown in FIGS. 1 and 2, respectively. As appears clear from FIGS. 1 and 2, the numbers of particles were 50 pieces/200 mmφ and the surface roughness in RMS value was 0.16 nm.

Figure 2:
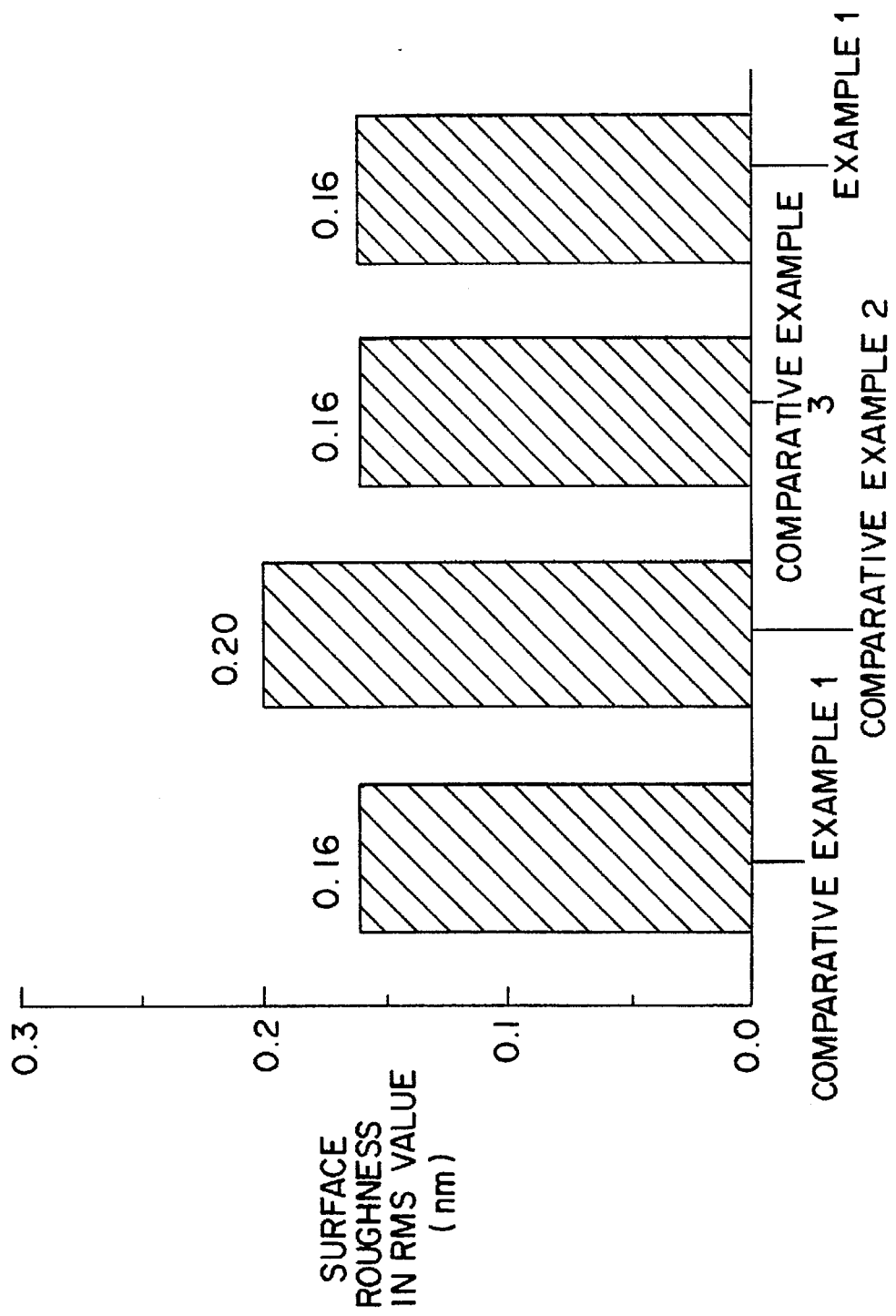
FIG. 2 is a graph showing the results of a measurement of the surface roughness of wafers after cleaning is achieved with respect to Example 1 and Comparative Examples 1–3.

It is clear from the measurement results shown in FIGS. 1 and 2 that the wafer cleaned by the brush-scrubbing process of this invention (Example 1) has an extremely reduced number of surface particles as compared to the particles left on the wafer surface in Comparative Example 1 and which are even reduced to some extent as compared to Comparative Examples 2 and 3. Regarding the surface roughness, the brush-scrubbed wafer of this invention (Example 1) is comparable to the surfaces of the wafers of Comparative Examples 1 and 3 and is superior to the surface of the wafer produced by the conventional cleaning method described in Comparative Example 2.

Although the examples described above utilizes sample wafers consisting of p-type silicon wafers, it was experimentally confirmed that the same effect could be attained even when n-type silicon wafers were used.

As described above, according to the wafer cleaning method of the present invention, it is possible to clean wafers efficiently without degrading the surface roughness (micro-roughness) of the wafer surface and with a substantial reduction of the level of particle impurities left on the cleaned wafer surface.

What is claimed is:

1. A semiconductor wafer cleaning method comprising the steps of:

(a) cleaning a polished surface of a wafer, comprising silicon with an aqueous solution comprising hydrofluoric acid;

(b) then, rinsing the wafer with a rinsing composition consisting essentially of water and ozone; and (c) thereafter, brush-scrubbing the wafer.

2. A semiconductor wafer cleaning method according to claim 1, wherein said pure water has an ozone concentration not less than 0.5 ppm and not greater than the saturated concentration of said ozone in said pure water at the temperature of said rinsing step.

3. A semiconductor wafer cleaning method according to claim 1 further including polishing said wafer surface prior to hydrofluoric acid treatment, whereby leaving particles comprising silica on said surface, and carrying out said hydrofluoric acid treatment under conditions sufficient to dissolve said particles comprising silica derived from polishing the wafer surface.

4. A semiconductor wafer cleaning method according to claim 1 further including polishing said wafer surface, prior to hydrofluoric acid treatment, with a polishing composition comprising silica and a surfactant; and subjecting said hydrofluoric acid treated wafer surface to treatment with said ozonated water under conditions sufficient to remove said surfactant from said surface.

* * * * *